(12) United States Patent
Lee

(10) Patent No.: US 8,173,584 B2
(45) Date of Patent: May 8, 2012

(54) COMPOSITION AND METHOD FOR TREATING SEMICONDUCTOR SUBSTRATE SURFACE

(76) Inventor: Wai Mun Lee, Milpitas, CA (US)

( * ) Notice: Subject to any disclaimer, the term of this patent is extended or adjusted under 35 U.S.C. 154(b) by 0 days.

(21) Appl. No.: 13/314,020

(22) Filed: Dec. 7, 2011

(65) Prior Publication Data

US 2012/0083436 A1    Apr. 5, 2012

Related U.S. Application Data

(62) Division of application No. 12/899,502, filed on Oct. 6, 2010, now Pat. No. 8,101,561.

(60) Provisional application No. 61/262,004, filed on Nov. 17, 2009.

(51) Int. Cl.
*C11D 7/50* (2006.01)
*G03F 7/42* (2006.01)

(52) U.S. Cl. .......... 510/175; 510/176; 510/260; 134/1.3
(58) Field of Classification Search ................... 510/175, 510/176, 260; 134/1.3
See application file for complete search history.

(56) References Cited

U.S. PATENT DOCUMENTS

| | | | |
|---|---|---|---|
| 3,992,313 A | 11/1976 | Anderson et al. | |
| 3,996,147 A | 12/1976 | Settineri et al. | |
| 4,104,303 A | 8/1978 | Anderson et al. | |
| 4,180,469 A | 12/1979 | Anderson | |
| 4,210,552 A | 7/1980 | Frenier et al. | |
| 4,283,219 A | 8/1981 | Wagner et al. | |
| 4,617,251 A | 10/1986 | Sizensky | |
| 4,770,713 A | 9/1988 | Ward | |
| 4,786,578 A | 11/1988 | Neisius et al. | |
| 4,824,762 A | 4/1989 | Kobayashi et al. | |
| 4,824,763 A | 4/1989 | Lee | |
| 4,904,571 A | 2/1990 | Miyashita et al. | |
| 5,279,771 A | 1/1994 | Lee | |
| 5,286,354 A * | 2/1994 | Bard et al. | 205/551 |
| 5,334,332 A | 8/1994 | Lee | |
| 5,381,807 A | 1/1995 | Lee | |
| 5,399,464 A | 3/1995 | Lee | |
| 5,419,779 A | 5/1995 | Ward | |
| 5,482,566 A | 1/1996 | Lee | |
| 5,556,482 A | 9/1996 | Ward et al. | |
| 5,563,119 A | 10/1996 | Ward | |
| 5,597,420 A | 1/1997 | Ward | |
| 5,672,577 A | 9/1997 | Lee | |
| 5,707,947 A | 1/1998 | Ward et al. | |
| 5,709,756 A | 1/1998 | Ward et al. | |
| 5,733,859 A | 3/1998 | Carrie et al. | |
| 5,753,601 A | 5/1998 | Ward et al. | |
| 5,798,323 A * | 8/1998 | Honda et al. | 510/176 |
| 5,902,780 A | 5/1999 | Lee | |
| 5,911,835 A | 6/1999 | Lee et al. | |
| 5,928,430 A | 7/1999 | Ward et al. | |
| 5,981,454 A | 11/1999 | Small | |
| 5,988,186 A | 11/1999 | Ward et al. | |
| 6,000,411 A | 12/1999 | Lee | |
| 6,110,881 A | 8/2000 | Lee et al. | |
| 6,121,217 A | 9/2000 | Lee | |
| 6,140,287 A | 10/2000 | Lee | |
| 6,156,661 A | 12/2000 | Small | |
| 6,165,341 A | 12/2000 | Sharifian et al. | |
| 6,187,730 B1 | 2/2001 | Lee | |
| 6,197,451 B1 | 3/2001 | Steinbrecher et al. | |
| 6,221,818 B1 | 4/2001 | Lee | |
| 6,224,785 B1 | 5/2001 | Wojtczak et al. | |
| 6,235,693 B1 | 5/2001 | Cheng et al. | |
| 6,242,400 B1 | 6/2001 | Lee | |
| 6,248,704 B1 | 6/2001 | Small et al. | |
| 6,276,372 B1 | 8/2001 | Lee | |
| 6,280,651 B1 | 8/2001 | Wojtczak et al. | |
| 6,313,039 B1 | 11/2001 | Small et al. | |
| 6,319,885 B1 | 11/2001 | Lee et al. | |
| 6,344,432 B1 | 2/2002 | Wojtczak et al. | |
| 6,367,486 B1 | 4/2002 | Lee et al. | |
| 6,383,410 B1 | 5/2002 | Wojtczak et al. | |
| 6,399,551 B1 | 6/2002 | Lee | |
| 6,492,311 B2 | 12/2002 | Lee et al. | |
| 6,514,471 B1 | 2/2003 | Hsiung et al. | |
| 6,546,939 B1 | 4/2003 | Small | |
| 6,564,812 B2 | 5/2003 | Lee | |
| 6,566,315 B2 | 5/2003 | Wojtczak et al. | |
| 6,620,256 B1 | 9/2003 | Arno et al. | |
| 6,677,286 B1 | 1/2004 | Rovito et al. | |
| 6,735,978 B1 | 5/2004 | Tom et al. | |
| 6,755,989 B2 | 6/2004 | Wojtczak et al. | |
| 6,773,873 B2 | 8/2004 | Seijo et al. | |
| 6,777,380 B2 | 8/2004 | Small et al. | |
| 6,821,352 B2 | 11/2004 | Rovito et al. | |
| 6,825,156 B2 | 11/2004 | Lee et al. | |
| 6,828,289 B2 | 12/2004 | Peters et al. | |
| 6,849,200 B2 | 2/2005 | Baum et al. | |
| 6,851,432 B2 | 2/2005 | Naghshineh et al. | |
| 6,896,826 B2 | 5/2005 | Wojtczak et al. | |
| 6,916,772 B2 * | 7/2005 | Zhou et al. | 510/201 |
| 6,943,142 B2 | 9/2005 | Egbe et al. | |
| 6,967,169 B2 | 11/2005 | Wojtczak et al. | |
| 7,012,051 B2 | 3/2006 | Daviot et al. | |
| 7,051,742 B2 | 5/2006 | Lee et al. | |
| 7,087,563 B2 | 8/2006 | Iwamoto et al. | |
| 7,119,052 B2 | 10/2006 | Korzenski et al. | |
| 7,129,029 B2 | 10/2006 | Egbe | |
| 7,135,445 B2 * | 11/2006 | Charm et al. | 510/175 |
| 7,144,848 B2 | 12/2006 | Zhou et al. | |

(Continued)

FOREIGN PATENT DOCUMENTS

DE    3828513    3/1990

(Continued)

*Primary Examiner* — Gregory Webb

(57) ABSTRACT

The present invention is directed to compositions and method of use for treating semiconductor substrate comprising a sulfonium compound and a nucleophilic amine in the fabrication of electronic devices. Optionally, the said composition further comprises a chelating agent, and solvent. The pH of the said solution can be adjusted with the addition of acid or base. The semiconductor manufacturing processes include steps for post etch residue, photoresist removal and steps during chemical mechanical planarization and post chemical mechanical planarization.

9 Claims, No Drawings

U.S. PATENT DOCUMENTS

| | | |
|---|---|---|
| 7,144,849 B2 | 12/2006 | Lee et al. |
| 7,160,815 B2 | 1/2007 | Korzenski et al. |
| 7,166,419 B2 | 1/2007 | Egbe |
| 7,192,910 B2 | 3/2007 | Wojtczak et al. |
| 7,195,676 B2 | 3/2007 | McDermott et al. |
| 7,205,265 B2 | 4/2007 | Lee |
| 7,211,553 B2 | 5/2007 | Subawalla et al. |
| 7,220,714 B2 | 5/2007 | Masuda et al. |
| 7,223,352 B2 | 5/2007 | Korzenski et al. |
| 7,235,188 B2 | 6/2007 | Daviot et al. |
| 7,250,391 B2 | 7/2007 | Kanno et al. |
| 7,252,718 B2 | 8/2007 | Carter |
| 7,267,727 B2 | 9/2007 | McDermott et al. |
| 7,273,060 B2 | 9/2007 | Patel et al. |
| 7,282,099 B2 | 10/2007 | McDermott et al. |
| 7,326,673 B2 | 2/2008 | Xu et al. |
| 7,361,631 B2 | 4/2008 | Egbe et al. |
| 7,387,130 B2 | 6/2008 | Lee et al. |
| 7,399,365 B2 | 7/2008 | Aoyama et al. |
| 7,449,127 B2 | 11/2008 | Verhaverbeke et al. |
| 7,456,140 B2 | 11/2008 | Small et al. |
| 7,485,611 B2 | 2/2009 | Roeder et al. |
| 7,517,809 B2 | 4/2009 | Korzenski et al. |
| 7,524,801 B2 | 4/2009 | Kneer |
| 7,528,098 B2 | 5/2009 | Lee et al. |
| 7,534,753 B2 | 5/2009 | Wu et al. |
| 7,543,592 B2 | 6/2009 | Lee |
| 7,547,669 B2 | 6/2009 | Lee |
| 7,557,073 B2 | 7/2009 | Korzenski et al. |
| 7,581,549 B2 | 9/2009 | Johnson et al. |
| 7,605,113 B2 | 10/2009 | Wojtczak et al. |
| 8,062,429 B2 * | 11/2011 | Lee ................................ 134/1.3 |
| 2003/0130149 A1 * | 7/2003 | Zhou et al. .................... 510/176 |
| 2004/0038840 A1 * | 2/2004 | Lee et al. ...................... 510/202 |
| 2004/0147421 A1 * | 7/2004 | Charm et al. ................. 510/176 |
| 2009/0107520 A1 * | 4/2009 | Lee et al. .......................... 134/2 |
| 2010/0043823 A1 * | 2/2010 | Lee ................................ 134/1.3 |
| 2010/0317869 A1 * | 12/2010 | Ishii et al. ..................... 548/406 |

FOREIGN PATENT DOCUMENTS

| | | |
|---|---|---|
| JP | 56-115368 | 9/1981 |
| JP | 63-208043 | 8/1988 |
| JP | 1-081949 | 3/1989 |
| JP | 5-045894 | 1/1991 |
| JP | 4-350660 | 12/1992 |

* cited by examiner

COMPOSITION AND METHOD FOR TREATING SEMICONDUCTOR SUBSTRATE SURFACE

CROSS-REFERENCE TO RELATED APPLICATIONS

The present application is divisional of application Ser. No. 12/899,502 filed Oct. 6, 2010 now U.S. Pat. No. 8,101,561, which claims priority from U.S. Provisional Appl. No. 61/262,004, filed Nov. 17, 2009, and are incorporated herein by reference in its entirety.

FIELD OF THE INVENTION

The present invention is a composition and method for use in semiconductor processes comprising a sulfonium compound, which is useful in the manufacturing processes of integrated devices, such as, but not limited to, photoresist stripping, post etch residue removal, chemical mechanical planarization and post chemical mechanical planarization particles removal.

BACKGROUND OF THE INVENTION

Semiconductor processing includes a number of processes and chemistries involved during processing. The front end manufacturing process, or wafer processing, includes wafer manufacturing, transistor formation (i.e., front-end of the line processing (FEOL)) and interconnect formation (i.e., back end of the line processing (BEOL)). The back end manufacturing process includes, for example, bumping and wafer level packaging. Throughout the manufacturing processes, metal surfaces may be exposed to potentially damaging solutions and chemistries that could compromise the performance of the ultimate product. Historically, protection of the critical metals was addressed with a focus on the particular solutions the metal would contact in the particular processing step.

This focus causes a blinder effect, which is exacerbated by different chemical companies applying proprietary chemistries that may or may not impact processes and chemistries downstream.

In addition, each processing step may involve several sub-steps that use different chemistries for different purposes. For example, modern integrated circuits typically comprise millions of active devices on a single substrate, electrically interconnected through the use of single and multilevel interconnections including conductive lines and plugs ("vias"). Conventionally, integrated circuit includes a semiconductor substrate and a plurality of sequentially formed dielectric layers and conductive patterns, including conductive lines, vias and interconnects. Typically, the conductive patterns on different layers, i.e., upper and lower layers, are electrically connected by a conductive interconnect or plug filling a via opening through the interlayer dielectric ("ILD"), while a conductive plug filling a contact opening establishes electrical contact with an active region on a semiconductor substrate, such as a source/drain region. A damascene technique can be employed to form interconnects by forming an opening or channel in the ILD and filling the opening with a conductive material, typically a metal. The metal typically fills the channel in the ILD and covers the field region atop the ILD between channels. Planarization typically is the next step, removing the metal in the field region, removing barrier/adhesion layers (if any), and providing a substantially planar surface for further coating and patterning. Each of these sub-steps may involve different chemistries and processing.

As integrated circuit manufacturing has become more complex and the dimensions of circuit elements fabricated on silicon or other semiconductor wafers have become smaller, continued improvement in techniques used to remove residues formed from such materials has been required. Moreover, in reduced geometry devices, the interconnect RC delay time may become the limiting factor of the device performance. This delay can be improved by combining low dielectric constant between tracks and the use of copper as a better conductor. Where copper and copper containing metallurgies are used in semiconductor applications, there is a need to protect the copper from corrosion and unwanted etching.

The photoresist stripper art is replete with numerous references to stripper combinations containing both a polar solvent and an amine compound. The presence of an amine in photoresist stripper compositions has been judged to be essential to effectively remove cross-linked resist films. However, amine-type photoresist strippers sometimes have a serious problem of corrosion, especially with aluminum substrates.

It is believed that the corrosion is caused in part by the ionization of water with the amine in post-stripping water rinses, as residual stripper solution may be retained on the substrate surface and/or substrate carrier after the stripping step. In other words, the amine component of the stripper composition does not corrode the substrate by itself, but may trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent washes.

Another serious problem related with currently used stripper compositions is mobile metallic ion transfer from a stripper solution onto a substrate. This results in damage of semiconductor integrated circuit devices by contamination with alkali or transition metals. Any metallic contamination leads to a short life of the devices.

The metallic contaminants may come from stripper components or photoresist components. Another mechanism of the contamination is corrosion of a stainless stripper bath with a stripper composition, particularly with an amine-based stripper, during the stripping process.

Because of the need for more effective chemistries at each processing step throughout the manufacture of an electronic device. There is a trend toward customized chemistry approaches for each processing step. Because of this, there is a need for an additive that can protect copper, copper alloy and other metals being applied with a broad spectrum of chemistries, processes, process conditions and process equipments.

Solvent/Amine Chemistries

Publications of U.S. Pat. Nos. 4,617,251, 4,770,713, 4,786,578, 4,824,762, 5,399,464, 4,824,763, and 4,904,571; Japanese Published Patent Application Nos. 56-115368, 63-208043, 1-081949, 4-350660, and 5-045894; and German Published Patent Application No. 3828513 describe comprehensive the means of photoresist stripping process for semiconductor fabrications and their composition containing the combination of a polar solvent, an amine compound and/or a corrosion inhibitor. The compositions and the mean of use are incorporated herein by reference in their entirety.

Hydroxylamine/Alkanolamine Chemistries

Illustrative of references suggesting photoresist stripper and residue remover compositions containing the combination of a nucleophilic amine, alkanolamine, polar solvent and a chelating compound are the following:

Publication of U.S. Pat. Nos. 7,387,130, 7,273,060, 7,250,391, 7,235,188, 7,205,265, 7,144,849, 7,135,445, 7,051,742, 7,012,051, 6,564,812, 6,546,939, 6,492,311, 6,399,551, 6,367,486, 6,319,885, 6,313,039, 6,276,372, 6,248,704, 6,242,400, 6,235,693, 6,187,730 and U.S. Pat. Nos. 6,221,818, 6,156,661, 6,140,287, 6,121,217, 6,110,881, 6,000,411, 5,981,454, 5,911,835, 5,902,780, 5,672,577, 5,482,566, 5,381,807, 5,334,332, 5,279,791, 5,279,771 assigned to EKC Technology, Inc. and U.S. Pat. Nos. 5,988,186, 5,928,430, 5,753,601, 5,709,756, 5,707,947, 5,597,420, 5,563,119, 5,556,482, 5,419,779 assigned to Air Products and Chemical, Inc. described comprehensive the means of photoresist stripping and residue removal processes for semiconductor fabrications and their composition containing a combination of a nucleophilic amine, alkanolamine, polar solvent and a chelating compound. The compositions and the mean of use are incorporated herein by reference in their entirety.

U.S. Pat. No. 5,334,332, issued to Lee, on Aug. 2, 1994, entitled "Cleaning compositions for removing etching residue and method of using", describe A stripping and cleaning composition for removing resists and etching residue from substrates containing hydroxylamine and at least one alkanolamine is described. Further, a cleaning composition for removing etching residue from semiconductor substrates containing hydroxylamine, at least one alkanolamine, at least one chelating agent, and water is described. The preferred chelating agent is 1,2-dihydroxybenzene or a derivative thereof. The chelating agent provides added stability and effectiveness to the cleaning composition, which is incorporated herein by reference.

U.S. Pat. No. 5,419,779, issued to Ward, on May 30, 1995, entitled "Stripping with aqueous composition containing hydroxylamine and an alkanolamine", disclosed an aqueous stripping composition comprising a mixture of about 55% to 70% by weight of monoethanolamine, about 22.5 to 15% by weight of hydroxylamine and water. The stripping composition is effective to strip photoresists, residues from plasma process generated, organic, metal-organic materials, inorganic salts, oxides, hydroxides or complexes in combination with or exclusive of organic photoresist films at low temperatures without redepositing any substantial amount of metal ions, which is incorporated herein by reference.

A related U.S. patent application, now U.S. Pat. No. 5,279,771, which is incorporated herein by reference and which corresponds to the published European Patent Application No. 485,161 A1, discloses hydroxylamine in combination with an alkanolamine which is miscible with the hydroxylamine as being useful to remove a resist from a substrate.

Fluoride Containing Chemistries

Numerous references suggesting photoresist stripper and residue remover compositions containing the combination of a source of fluoride and a chelating compound.

Examples are, but not limited to, U.S. Pat. Nos. 7,547,669, 7,543,592, 7,528,098, 7,456,140, 7,399,365, 7,252,718, 7,235,188, 7,144,848, 6,916,772, 6,825,156, 6,777,380, and 7087563 assigned to EKC Technology, Inc; U.S. Pat. Nos. 7,605,113, 7,557,073, 7,517,809, 7,485,611, 7,326,673, 7,223,352, 7,160,815, 7,119,052, 6,967,169, 6,896,826, 6,851,432, 6,849,200, 6,77,3873, 6,755,989, 6,735,978, 6,620,256, 6,566,315, 6,383,410, 6,344,432, 6,280,651, and 6,224,785 assigned to Advanced Materials Technology, Inc; U.S. Pat. Nos. 7,581,549, 7,534,753, 7,524,801, 7,361,631, 7,282,099, 7,267,727, 7,220,714, 7,211,553, 7,195,676, 7,166,419, 7,129,029, 6,943,142, 6,828,289, 6,821,352, 6,677,286, and 6,514,471 assigned to Air Products and Chemicals, Inc. described comprehensive the means of photoresist stripping and residue removal processes for semiconductor fabrications and their composition containing the combination of a source of fluoride and an chelating compound; optionally containing carboxylic acid and solvent. The compositions and the mean of use are incorporated herein by reference in their entirety.

Illustrative of references for fluoride containing composition and method of use are the following:

U.S. Pat. No. 7,534,753, which is incorporated herein by reference in their entirety, disclosed a residue cleaning composition includes: (a) water; (b) a fluoride; (c) a pH buffer system including an organic acid and a base. The organic acid can be an aminoalkylsulfonic acid and/or an aminoalkylcarboxylic acid. The base can be an amine and/or a quaternary alkylammonium hydroxide. The composition is substantially free of an added organic solvent and has a pH ranging from about 5 to about 12. A method of removing residue from a substrate includes contacting the residue with the cleaning composition. A method for defining a pattern includes the steps of 1) etching the pattern through a photoresist into a substrate, 2) heating the patterned substrate to a temperature sufficient to ash the photoresist to provide a residue, and 3) removing the residue by contacting the residue with the cleaning composition.

U.S. Pat. No. 7,605,113 which is incorporated herein by reference in their entirety disclosed a semiconductor wafer cleaning formulation, including 1-35% wt. fluoride source, 20-60% wt. organic amine(s), 0.1-40% wt. nitrogenous component, e.g., a nitrogen-containing carboxylic acid or an imine, 20-50% wt. water, and 0-21% wt. metal chelating agent(s). The formulations are useful to remove residue from wafers following a resist plasma ashing step, such as inorganic residue from semiconductor wafers containing delicate copper interconnecting structures.

U.S. Pat. No. 6,492,311, which is incorporated herein by reference, issued to Lee et al on Dec. 10, 2002, entitled "Ethyenediaminetetraacetic acid or its ammonium salt semiconductor process residue removal composition and process" described the composition and the mean of removing photoresist and other residue from integrated circuit substrates containing ethylenediaminetetraacetic acid or a mono-di-tri- or tetraammonium salt.

In general, fluoride sources disclosed in these applications are hydrofluoric acid, fluoride salts, such as ammonium fluoride, etc. For example, U.S. Pat. No. 7,192,910 described a fluorine-containing compound as an active agent such as a quaternary ammonium fluoride, a quaternary phosphonium fluoride, sulfonium fluoride, more generally an -onium fluoride or "multi" quaternary-onium fluoride that includes two or more quaternary-onium groups linked together by one or more carbon-containing groups.

U.S. Pat. No. 7,449,127, which is incorporated herein by reference in their entirety, described such suitable chelating agents include polyacrylates, carbonates, phosphonates, and gluconates. There are several specific chelating agents that would be particularly useful as part of the cleaning solution. They are: ethylenediaminetetraacetic acid (EDTA), N,N'-bis(2-hydroxyphenyl)ethylenediiminodiacetic acid (HPED), triethylenetetranittrilohexaacetic acid (TTHA), desferriferrioxamin B, N,N',N"-tris[2-(N-hydroxycarbonyl)ethyl]-1,3,5-benzenetricarboxamide (BAMTPH), and ethylenediaminediorthohydroxyphenylacetic acid (EDDHA).

U.S. Pat. No. 7,205,265, issued to Lee, on Apr. 17, 2007, entitled "Cleaning compositions and methods of use thereof", which is incorporated herein by reference in their entirety, disclosed a remover composition and method for removing resists from substrates containing nucleophilic amine and at least one solvent is described. Optionally, a chelating agent can also be included in the remover composition. The remover composition is especially suitable for removing a variety of resists from substrates at different stages in the process of manufacturing integrated circuits. The preferred nucleophilic amine compounds having reduction and oxidation potentials are alkoxy substituted amines, hydroxylamine, alkyl or carboxyl substituted hydroxylamine, and alkyl or carboxyl substituted hydrazine. The most preferred compounds are hydroxylamine, N-methyl-hydroxylamine hydrochloride, N,N-diethylhydroxylamine, and methylhydrazine U.S. Pat. No. 6,825,156 issued to Lee, et al. on Nov. 30, 2004, entitled "Semiconductor process residue removal composition and process", which is incorporated herein by reference in their entirety, describes a residue remover for removing polymeric material and etch residue includes 2-(2-aminoethylamino)-ethanol and optionally another two-carbon atom linkage alkanolamine compound, gallic acid or catechol, water, a polar organic solvent, and hydroxylamine. A process for removing photoresist or other residue from a substrate, such as an integrated circuit semiconductor wafer including titanium metallurgy, includes the steps of contacting the substrate with the above composition for a time and at a temperature sufficient to remove the photoresist or other residue from the substrate. Use of 2-(2-aminoethylamino)-ethanol in the composition and process provides superior residue removal without attacking titanium or other metallurgy on the substrate. The composition preferably has a flash point greater than about 130° C. Examples of alkanolamine compounds include, but are in no way limited to, DGA, 2-aminoethanol ("monoethanolamine" or "MEA"), 2-(N-methylamino) ethanol ("monomethyl ethanolamine" or "MMEA"), 2-amino-1-propanol ("monoisopropanolamine" or "MIPA"), 2-(N-hydroxyethyl-amino)-ethanol ("diethanolamine" or "DEA"), 2-[(2-aminoethyl)-(2-hydroxyethyl)-amino]-ethanol ("N,N-bis-hydroxyethyl-ethylenediamine"), N,N,N-tris-(2-hydroxyethyl)-ammonia ("triethanolamine" or "TEA"), N-aminoethyl-N-hydroxyethyl-ethylenediamine, N,N'-dihydroxyethyl-ethylenediamine, 2-[2-(2-aminoethoxy)-ethylamino]-ethanol, 2-[2-(2-aminoethylamino)-ethoxy]-ethanol, 2-[2-(2-aminoethoxy)-ethoxy]-ethanol, tertiarybutyldiethanolamine, isopropanolamine, diisopropanolamine, 3-amino-1-propanol ("n-propanolamine" or "NPA"), isobutanolamine, 2-(2-aminoethoxy)-propanol; 1-hydroxy-2-aminobenzene; or the like, or any combination thereof.

The composition and the mean of using in the fabrication of semiconductor device disclosed in these applications, and other portions of the disclosures recognized by one of skill in the art as pertinent to the present invention, are incorporated herein for all purposes as if expressly contained herein.

The nucleophilic amines, alkanolamine, organic solvents, and chelating agent disclosed in these applications have achieved substantial success in integrated circuit fabrication applications for device using aluminum as wiring metal; these compositions lack the compatibility with the advance semiconductor device which utilizes copper as the choice for wiring metal.

The fluoride containing compositions disclosed in these applications have found use of removing residues from devices using aluminum and copper as conducting metals. These compositions lack the robustness to achieve broad applications.

There is a need for the development of new cleaning compositions that allow the most effectiveness in removing residue from both copper and aluminum metals without compromising the surfaces that are intended to remain protected.

It is an objective of this invention to provide an additive approach to treating metal surfaces to reduce corrosion throughout the semiconductor processing steps and allow for a uniform approach in a broad spectrum of chemistries that will enable the use of the most effective chemistries without compromising protection of the metal surfaces being used in the manufacturing electronic devices, such as copper, copper alloys, aluminum, zinc, zinc alloys, stainless steels, tin, silver etc.

It is also an objective of this application to identify chemical synergies that provide a more favorable approach throughout the semiconductor processing steps.

It is further an objective of this invention to provide improved compositions for removing a broad range of resists, metal oxide residues, polymers (e.g., organometallic), and planarization residues while inhibiting the corrosion of metal surface over a broad range of applications and processes. In particular, the compositions are less aggressive toward copper and copper containing materials and suitable for meeting current semiconductor fabrication requirements.

Sulfonium ion, also known as sulphonium ion and sulfanium ion, is a positively charged sulfur ion carrying three carbon groups as substituents ($S^+R_3$). Ionic compounds consisting of a positively charged sulfonium cation and a negatively charged anion are called sulfonium salts. Sulfonium compounds have found many uses, such as surfactant in detergent, corrosion inhibitor in electrolyte solution, lubricant, adhesion promoter, photo-initiator, etc. Sulfonium hydroxide has been mentioned as strong base in photoresist stripper application.

U.S. Pat. No. 6,197,451 to Steinbrecher et al., which issued on Mar. 6, 2001, entitled "Corrosion inhibiting electrolytic solutions" teaches the use of sulfonium as corrosion inhibitor in an electrolyte solution; which is incorporated herein by reference.

U.S. Pat. No. 5,733,859 to Carrie, et al, which is issued on Mar. 31, 1998 entitled "Maleic acid-based aqueous cleaning compositions and methods of using same", teaches the use of with sulfonium group as suitable zwitterionic surfactants in formulating detergent composition; which is incorporated herein by reference.

U.S. Pat. No. 4,904,571, which issued to Miyashita et al. on Feb. 27, 1990, teaches the use of sulfonium hydroxides as alkali components in their stripping composition; which is incorporated herein by reference.

U.S. Pat. No. 4,210,552 was issued to Frenier, et al. Jul. 1, 1980, entitled "Sulfonium compounds as corrosion inhibitors in aqueous acidic cleaning solutions" describes additional sulfonium salts which are useful corrosion inhibitors in aqueous acidic cleaning solutions, which is incorporated herein by reference.

U.S. Pat. No. 4,180,469 which issued to Anderson, Dec. 25, 1979, entitled "Dithiocarbamate sulfonium salt inhibitor composition" teaches the boiler cleaning compositions comprising mixtures of a dithiocarbamic acid derivative and a sulfonium compound such as triphenylsulfonium chloride provide effective corrosion inhibition in acid treatment of metal in the presence of a copper complexing agent such as a thiourea; which is incorporated herein by reference.

U.S. Pat. Nos. 3,992,313 and 4,104,303, which issued to Anderson, et al. entitled "Acid inhibitor composition and process in hydrofluoric acid chemical cleaning" teaches the use of a boiler cleaning solution containing Mannich base and thiourea inhibitor composition and method of inhibiting the acid attack by aqueous hydrofluoric acid on ferrous metal surfaces, and in particular, highly reactive ferrous metal surfaces; which is incorporated herein by reference.

U.S. Pat. No. 3,996,147, which issued to Settineri, et al., Dec. 7, 1976, entitled "Novel sulfonium corrosion inhibitors in aqueous acid" teaches a method and composition for the prevention of corrosion of ferrous metal on a boiler surfaces in contact with aqueous acid cleaning solutions is inhibited by sulfonium salts. These sulfonium salts are effective corrosion inhibitors even in the presence of ferric ions.

SUMMARY OF THE INVENTION

Although the compositions are particularly preferred for use where the substrate or surface contacting the composition involves copper or copper compounds, the compositions are effective removers when used with other substrates that do not contain copper or copper alloy, such as aluminum, zinc, tungsten, tin, lead, titanium, silver and their alloys, etc. and dielectric containing materials, such as silicon dioxide, low-k dielectrics and the like.

The method of removing a resist or etching residue from a substrate using the compositions of the present invention also is advantageous in that complex process steps and equipment are not required.

One embodiment of the present invention involves contacting a substrate containing a resist or etching residue or planarization contaminant with the composition of the invention as described herein at a temperature and for a time sufficient to remove the particular resist or etching residue or contaminant present.

One embodiment of the present invention relates to a composition comprising sulfonium compounds in semiconductor processing steps during the manufacture of a semiconductor product to inhibit metal corrosion involved in such processing steps, for example, for removing a broad range of resists, residues, polymers (e.g., organometallic), planarization residues and protect copper surface during and after chemical mechanical planarization. Said compositions are less aggressive toward metal containing substrate and suitable for meeting current semiconductor fabrication requirements.

One embodiment of the present invention is directed to cleaning compositions and their use in semiconductor applications, wherein such compositions comprise at least one sulfonium compound, at least one nucleophilic amine compound having oxidation and reduction potentials; and water; optionally, it further comprises at least one chelating agent; optionally, it further comprises a solvent. The water can be added to the composition by itself or as a carrier for another component, such as the nucleophilic amine compound, i.e., the nucleophilic amine is present in aqueous solution.

One embodiment of the invention relates to a cleaning composition comprising: a) one or more sulfonium or salts thereof; b) one or more chelating agents or salts thereof; c) one or more non oxidizing acid or salts thereof; and d) water.

One embodiment of the invention relates to a cleaning composition comprising a) hydroxylamine or a salt thereof; b) an alkanolamine; c) chelating agent or a salt thereof; d) a sulfonium or a salt thereof, and e) water.

One embodiment of the invention relates to a composition comprising a) hydroxylamine or a salt thereof; b) a sulfonium or a salt thereof; c) metal ion free base; and d) optionally an organic solvent.

One embodiment of the invention relates to a composition comprising a) a sulfonium or a salt thereof; b) a hydroxy-substituted carboxylic acid; and c) water.

One embodiment of the invention relates to a method of removing one or more of resist, etching residue, and planarization residue from a copper containing substrate comprising contacting the substrate with the compositions of the invention.

One embodiment of the invention is a method of removing one or more of resist, etching residue, and planarization residue from a semiconductor substrate.

Examples of nucleophilic amine compounds useful in the present invention include hydroxylamines, hydrazines, certain specified amines, and their derivatives as further described below.

One embodiment of the invention relates to a composition wherein additional chelating agents, such as those known in the art, can also be used in the compositions of the present invention are catechol, gallic acid, thiophenol, nitrilotriacetic acid (NTA), ethylenediaminetetraacetic acid (EDTA), N,N'-bis(2-hydroxyphenyl)ethylenediiminodiacetic acid (HPED), triethylenetetranitrilohexaacetic acid (TTHA), desferriferrioxamin B,N,N',N"-tris[2-(N-hydroxycarbonyl)ethyl]-1,3,5-benzenetricarboxamide (BAMTPH), ethylenediaminediorthohydroxyphenylacetic acid (EDDHA), ethylenediaminetetramethylenephosphonic acid (EDTMP), α-(hydroxyimino)phosphonic acid, propylenediaminetetraacetic acid (PDTA), hydroxypropylenediaminetetraacetic acid (HPDTA), isoserinediacetic acid (ISDA), β-alaninediacetic acid (β-ADA), hydroxyethanediphosphonic acid, diethylenetriaminetetraacetic acid, diethylenetriaminetetramethylenephosphonic acid, 1-hydroxyethane, 1,1 diphosphonic acid, methylene disphosphonic acid, hydroxymethylene diphosphonic acid, dichloromethylene disphosphonic acid, hydroxycyclohexylmethylene disphosphonic acid, 1-hydroxy-3-aminopropane 1,1 diphosphonic acid, 1-hydroxy-4-aminobutane, 1,1 diphosphonic acid, hydroxyethyleneaminodiacetic acid, hydroxyethylethylenediaminetriacetic acid, diethylenetriaminepentaacetic acid, diethanolglycine, ethanolglycine, citric acid, glycolic acid, glyoxylic acid, acetic acid, lactic acid, phosphonic acid, glucoheptonic acid or tartaric acid, polyacrylates, carbonates, phosphonates, and gluconates, dithiocarbamates and mixtures thereof.

One embodiment of the invention relates to a composition wherein the nucleophilic amine is present in an amount of from about 0.1 to about 50 percent by weight, the organic solvent is present in an amount of from about 0 to about 80 percent by weight, the chelating agent is present in an amount of from about 0 to about 30 percent by weight, the sulfonium compound is present in an amount from about 2 mmoles per liter and the balance is water.

One embodiment of the invention relates to a composition wherein the pH of the said composition is adjusted with either acid or base to optimize the performance.

While the nucleophilic amine compound must have the potential for reduction and oxidation, it is not required that reduction and oxidation actually occur in the use of the composition.

The organic solvent is an alkanolamine,

Sulfonium ion, also known as sulphonium ion and sulfanium ion, is a positively charged sulfur ion carrying three carbon groups as substituent. Ionic compounds consisting of a positively charged sulfonium cation and a negatively charged anion are called sulfonium salts corresponding to the general formula I:

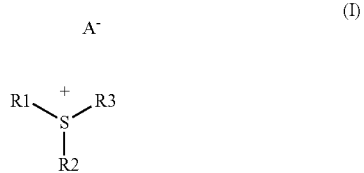

wherein R1, R2 and R3 can be independently alkyl, hetero-alkyl, alkyl-aryl, or alkyl-heteroaryl groups and combination thereof. In this case, a counter-ion (A) balances the positive charge on the sulfur atom. Any counters ion may be used, for example anion selecting from the group consisting of $Cl^-$, $F^-$, $Br^-$, $I^-$, $HSO_4^-$, $H_2PO_4^-$, $NO_3^-$, $BF_4^-$, tosylate, acetate and the likes, as further described below.

The sulfonium compound contains at least one strong electron withdraw substation group in the molecule, such strong electron withdrawing group including, but not limited to, halo, cyano, nitro, carboxyl, sulfo, trifluoromethyl, trichloromethyl or the likes and combination of thereof.

One embodiment includes the use of sulfonium to passivate copper surfaces using solution chemistries throughout processing of a semiconductor.

In these uses, the sulfonium compounds are effective at low concentrations in an amount of 0.1 mmoles per liter.

These and other related objectives are attained through the use of the compositions and processes disclosed herein.

DETAIL DESCRIPTION

Definitions

Unless otherwise specified, all percentages expressed herein should be understood to refer to percentages by weight. Also, the term "about," when used in reference to a range of values, should be understood to refer to either value in the range, or to both values in the range.

As used herein, the phrases "contains substantially no" and "is substantially free from," in reference to a composition means a negligible amount.

Preferably, when one of the aforementioned phrases is used, the composition is completely free of any added element specifically mentioned thereafter, or at least does not contain the added element in an amount such that the element affects the efficacy, storability, usability regarding necessary safety concerns, or stability of the composition.

Unless otherwise specified, and wherever possible, a compound should generally not be characterized under more than one enumerated element of the composition according to the invention. If a compound is capable of being characterized under, for example, two enumerated embodiments of the composition, such a compound may be characterized herein only under either one of the two enumerated elements, but not under both. At times, the distinction may be made based on the content of the compound in the composition. For instance, dialkylphosphonic acid can act primarily as a corrosion inhibitor at "low" concentrations, i.e., about 10 to 50 ppm, or primarily as a metal chelator at "high" concentrations, i.e., in the ppm to 0.5 wt % range.

As used herein, the term "contacting" refers to any means of bringing the substrate or surface and the compositions of the present invention together physically and includes, but is not limited to, immersing, spraying, micro-droplet fogging, and the like.

Compositions containing sulfonium compounds have been found to inhibit metal corrosion in processes relating to electronic component fabrication, including TFT LCD processes, printed circuit board processes, and processes relating to the fabrication of electronic substrates.

Without any restriction to a potential theory, it is believed that the sulfonium compounds show a bidentate metal chelation through the terminal thio groups, which acts to passivate the metal surface to reduce the corrosion/etch rate during treatment. While the nucleophic amine functions as oxygen scavenger to reduce the oxygen content in the mixture to prevent further oxidation of the metal surface. The combination of sulfonium compound and nucleophilic amine produce a synergistic effect in the cleaning solution.

Cleaning Solution Component

Sulfonium Compound

Preferred sulfonium compounds corresponding to the general formula II:

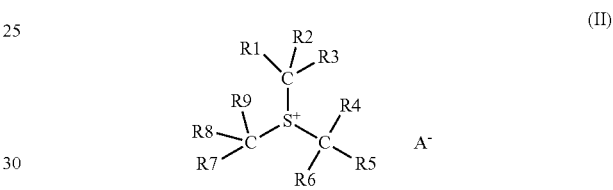

wherein R1, R2, R3, R4, R5, R6, R7, R8 and R9 can be independently hydrogen, alkyl, hetero-alkyl, alkyl-aryl, or alkyl-heteroaryl groups R may be an alkyl group (in other words, a group containing carbon and hydrogen). The alkyl group may be completely saturated or may contain unsaturated groups (i.e. may contain alkene and alkyne functional groups, so the term "alkyl" encompasses the terms "alkylene" and "alkylene" within its scope). The alkyl group may be straight-chained or branched. The alkyl group may be unsubstituted (i.e. the alkyl group contains only carbon and hydrogen). The unsubstituted alkyl group may be unsaturated or saturated. Examples of possible saturated unsubstituted alkyl groups include methyl, ethyl, n-propyl, sec-propyl, cyclopropyl, n-butyl, sec-butyl, tert-butyl, cyclobutyl, pentyl (branched or unbranched), hexyl (branched or unbranched), heptyl (branched or unbranched), octyl (branched or unbranched), nonyl (branched or unbranched), and decyl (branched or unbranched). Saturated unsubstituted alkyl groups having a greater number of carbons may also be used. Cyclic alkyl groups may also be used, so the alkyl group may comprise, for example, a cyclopropyl group, a cyclobutyl group, a cyclopentyl group, a cyclohexyl group, a cycloheptyl group, a cyclooctyl group, a cyclononyl group and/or a cyclodecyl group. These cyclic alkyl groups may directly append the sulfur atom or may be joined to the sulfonium through one or more carbon atoms.

The alkyl group may also be substituted with one or more hetero-atoms or group of hetero-atoms. If more than one hetero-substituent is present, the substituents are independently selected from one another unless they form a part of a particular functional group (e.g. an amide group). Groups containing hetero-atoms joined to carbon atoms are contained within the scope of the term "heteroalkyl" as discussed In this case, a counter-ion ($A^-$) balances the positive charge on the sulfur atom. Any counters ion may be used, for example anion selecting from the group consisting of $Cl^-$, $F^-$, $Br^-$, $I^-$, $HSO_4^-$, $H_2PO_4^-$, $NO_3^-$, $BF_4^-$, tosylate, acetate and the likes.

One embodiment of the present invention, the sulfonium salts correspond to the following formulas:

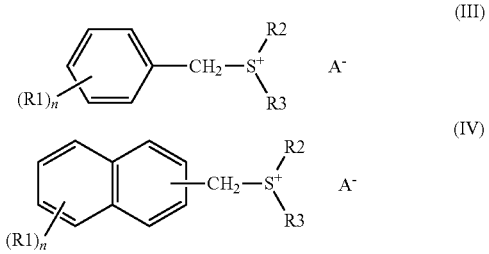

Examples of suitable sulfonium salts are those in III and IV wherein: n=1 or 2; R1 is an electron withdrawing substituent inert towards the sulfonium moiety and is stable in the cleaning solutions selected from a group of halo, cyano, nitro, carboxyl, sulfo, trifluoromethyl, trichloromethyl, hydrogen or a hydrocarbyl radical, such as alkyl (e.g. methyl, ethyl, propyl, butyl, hexyl, octyl, decyl, dodecyl, and the like), aryl (e.g. phenyl, naphthyl, and the like), aralkyl (e.g. benzyl, phenethyl, and the like), alkaryl (e.g. tolyl, 3,5-dimethylphenyl, butylphenyl, and the like), cycloalkyl (e.g. cyclohexyl and the like), alkenyl (e.g. vinyl, allyl, butenyl, hexenyl, and the like); or hydrocarbyloxy, such as alkoxy, aryloxy, alkenyloxy, etc. (e.g. butoxy, phenoxy, p-hydroxyphenoxy, hexylphenoxy, chlorophenoxy, allyloxy, and the like); or hydrocarbylthio radicals, such as alkylthio, arylthio, etc. (e.g. methylthio, ethylthio, butylthio, phenylthio, and the like);

R2 is a hydrocarbyl radical, such as alkyl (e.g. methyl, ethyl, propyl, butyl, hexyl, octyl, decyl, dodecyl, and the like), aryl (e.g. phenyl, hydroxyphenyl and the like), aralkyl (e.g. benzyl, phenethyl, phenylbutyl, and the like), alkaryl (e.g. tolyl, 3,5-dimethylphenyl, butylphenyl, hexylphenyl, and the like), cycloalkyl (e.g. cyclohexyl, and the like), alkenyl (e.g. allyl, butenyl, hexenyl, and the like; or R3 is an alkyl radical of from 1 to 4 carbon atoms (i.e. methyl, ethyl, propyl and butyl) or an inertly-substituted alkyl radical of 1 to 4 carbon atoms, allyl, phenyl or inertly-substituted phenyl. By "inertlysubstituted" as used in this application is meant that the hydrocarbyl radical bears one or more substituents which are inert to the liquid acidic medium in which the sulfonium corrosion inhibitors are to be used. Such inert substituents include hydroxy, halo, etc. Thus, R3 includes hydroxyalkyl radicals of 1 to 4 carbon atoms, chloroalkyl radicals, and the like;

R2 and R3 can be joined to form, in combination with the sulfonium atom, a 5-or 6-membered heterocyclic ring (such as thiophenium, tetrahydrothiophenium, thiopyrylium and tetrahydrothiopyrylium); with the proviso that the total aggregate carbon content of R1 and R2 is from 7 to about 25 and, with the additional proviso that the total aggregate carbon content of R1, R2 and R3 is from 10 to about 25 when R2 and R3 are joined to form the 5-or 6-membered heterocyclic rings;

Anion ($A^-$) is a compatible anion. The choice of Anion ($A^-$) is not critical and may be varied to convenience. However, the anion is generally chosen to be the same as the acid in solution as a matter of convenience. The anion may be selected by the method of preparing the sulfonium salt or by ion exchange means. Examples of suitable anions include chloride, bromide, iodide, nitrate, bisulfate, tosylate, acetate, benzoate, dihydrogen phosphate, tetrafluoroborate, phosphate, and the like.

The ring position of the R1 substituent(s) in III and IV is not critical but is preferably at least two ring carbons removed from the $—(CH_2—S^{+1}—R2-R3)\ A^-$ group.

The preferred formula of III and IV, wherein, n is 1; R1 is preferably a meta-or para-substituent (most preferably para), is preferably hydrogen, alkyl or alkylphenoxy and is most preferably alkyl of 8 to 18 carbon atoms, halo, cyano, nitro, carboxyl, sulfo, trifluoromethyl, trichloromethyl; R2 is preferably alkyl, β-hydroxyalkyl of 2 to 4 carbon atoms (i.e., β-hydroxyethyl, β-hydroxypropyl and, β-hydroxybutyl), allyl, phenyl or hydroxy-phenyl, and is most preferably alkyl, β-hydroxyethyl or alkyl; R3 is preferably alkyl of 1 to 4 carbon atoms, β-hydroxyalkyl of 2 to 4 carbon atoms, allyl, phenyl or hydroxyphenyl, and is most preferably alkyl of 1 to 4 carbon atoms, β-hydroxyethyl or allyl.

The preferred sulfonium salts are, of course, a combination of the above preferences for R1-R3 and n. Likewise, the most preferred sulfonium salts are a combination of the most preferred embodiments for R1-R3 with n being 1.

Representative examples of suitable sulfonium salts for use herein include those in Formula III having the following values for R1, R2 and R3 and anion ($A^-$).

TABLE I

| No. | R1 | R2 | R3 | $A^-$ |
|---|---|---|---|---|
| 1 | p-I | $C_8H_{17}$ | $C_2H_4OH$ | Cl |
| 2 | o-C(O)CH$_3$ | $C_{18}H_{37}$ | $CH_3$ | $HSO_4$ |
| 3 | m-C(O)C$_6$H$_5$ | $C_6H_{13}$ | $CH_2CH=CH_2Br$ | |
| 4 | m-SO$_3$H | $C_{24}H_{49}$ | $CH_3$ | I |
| 5 | p-Cl | $CH_2—C_6H_4—C_4H_9$ | $CH_3$ | Tosylate |
| 6 | p-CCl$_3$ | Cyclohexyl | $CH_2CH_2CN$ | Acetate |
| 7 | p-COOH | $—C6H4—C12H25$ | $CH_3$ | $H_2PO_4$ |
| 8 | m-SO$_3$H | $C_{10}H_{20}$ | $C_4H_8OH$ | $NO_3$ |
| 9 | p-S(O)(O)CH$_3$ | $C_{12}H_{25}$ | $C_6H_5$ | Br |
| 10 | p-NO$_3$ | $CH_2CH=CH_2$ | $C_6H_4Cl$ | Cl |
| 11 | o-NO$_3$ | $C_6H_{13}$ | $C_2H_5$ | $H_2PO_4$ |
| 12 | $CH_3$ | $C_{18}H_{37}$ | $CH_3$ | Cl |
| 13 | $C_3H_7$ | $C_{10}H_{21}$ | $C_2H_5$ | $HSO_4$ |
| 14 | $C_6H_{13}$ | $CH_3$ | $C_6H_5$ | Cl |
| 15 | $C_8H_{17}$ | $CH_2=CHCH_2$ | $CH_2=CHCH_2Br$ | |
| 16 | $C_{12}H_{25}$ | $CH_3$ | $CH_2CH_2OH$ | Cl |
| 17 | $C_{18}H_{37}$ | $CH_3$ | $CH_3$ | I |
| 18 | $C_{20}H_{41}$ | $CH_3$ | $CH_2=CHCH_2Cl$ | |
| 19 | $C_8H_{17}O$ | $CH_2CH_2OH$ | $CH_2CH_2OH$ | NO3 |
| 20 | $C_4H_9S$ | $C_{12}H_{25}$ | $C_3H_7$ | Tosylate |
| 21 | $C_6H_5$ | $CH_3$ | $CH_3$ | $H_2PO_4$ |
| 22 | $C_6H_5O$ | $C_6H_{13}$ | $CH_3$ | Acetate |
| 23 | $C_4H_9C_6H_4O$ | $CH_2CH_2OH$ | $CH_2CH_2OH$ | Cl |
| 24 | $C_8H_{17}C_6H_4O$ | $CH_3CH=CHCH_2$ | $C_4H_9$ | Br |
| 25 | $C_6H_5CH_2CH_2$ | $C_3H_7$ | $C_3H_7$ | I |
| 26 | Cyclohexyl | $C_4H_9$ | $CH_3$ | $NO_3$ |
| 27 | $C_6H_5S$ | $CH_3$ | $C_6H_5OH$ | Cl |
| 28 | H | $C_6H_5CH_2CH_2$ | $CH_3$ | $HSO_4$ |
| 29 | $CH_2=CH$ | $C_8H_{17}$ | $CH_3$ | Cl |
| 30 | $CH_2=CHCH_2$ | $C_{12}H_{25}$ | $C_2H_4$ | Cl |
| 31 | $CH_2=CHCH_2—O—$ | $C_6H_{13}$ | $CH_3$ | I |
| 32 | 3-ethyl, 5 ethyl | $C_8H_{17}$ | $CH_2CH_2OH$ | Cl |
| 33 | 2 methyl, 4 methyl | $C_{18}H_{37}$ | $CH_3$ | Br |

The sulfonium compounds within Formula III and IV having corresponding R1, R2 and R3 and anion ($A^-$) values as in Table I are likewise representative compounds of the sulfonium salts within Formula IV.

Other suitable compounds according for formula III and IV include the following

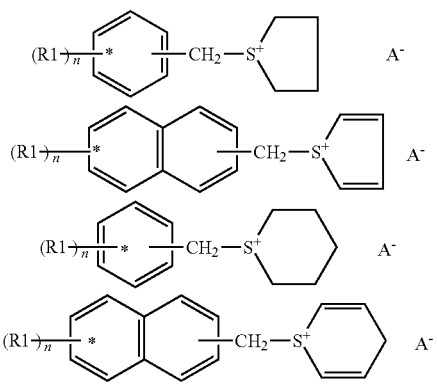

wherein n is 1 in each case and R1 and A⁻ have the following values:

TABLE II

| R1 | A⁻ |
|---|---|
| $C_6H_{13}$ | Cl |
| $C_8H_{17}$ | Br |
| $C_{10}H_{21}$ | I |
| $C_{12}H_{25}$ | $HSO_4$ |
| $C_{18}H_{37}$ | Cl |

In another embodiment, the sulfonium salt corresponding to the formula V,

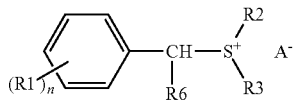
(V)

wherein n is 1 or 2; each R1 independently is hydrogen or a hydrocarbyl, a hydrocarbyl whose chain length is interrupted by an atom of oxygen or sulfur, a hydrocarbyloxy or a hydrocarbylthio radical of from 1 to about 24 carbon atoms; such as

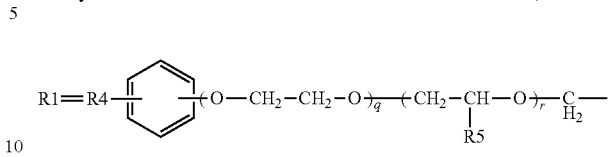

R2 is a hydrocarbyl or inertly substituted hydrocarbyl radical of from 1 to about 24 carbon atoms, with the proviso that the total aggregate carbon content of R1 and R2 is from 7 to about 25; R3 is an alkyl radical of from 1 to 4 carbon atoms or an inertly-substituted alkyl radical of from 2 to 4 carbon atoms, allyl, phenyl or an inertly-substituted phenyl radical; or R2 and R3 are joined to form a 5- or 6-membered heterocyclic ring, with the proviso that the total aggregate carbon content of R1, R2 and R3 is from 10 to, about 25;

R4 is alkyl of 4 to about 20 carbon atoms;

R5 is hydrogen, methyl or ethyl; R6 is hydrogen, methyl or ethyl;

q is an integer of from 1 to 8; r is an integer of from 0 to 12, with the proviso that the sum of q plus r is equal to or less than 12; and A⁻ is an Anion.

For example, such sulfonium can be represented as,

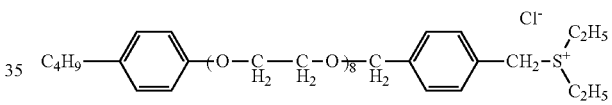

wherein n=1; Anion=Cl; R2 and R3=C2H5; R4=C4H9; R5 and R6=H

In another embodiment, other non-limited examples of sulfonium compounds include

| Compound | Name |
|---|---|
| | (Ethoxycarbonylmethyl)dimethylsulfonium bromide |
| | (3-Amino-3-carboxypropyl) dimethylsulfonium bromide |
| | Dimethylphenacylsulfoniu tetrafluoroborate |

-continued

| Compound | Name |
|---|---|
| (structure) | Trimethylsulfoxonium chloride |
| (structure) | Trimethylsulfoxonium iodide |
| (structure) | p-Xylylenebis(tetrahydrothiophenium chloride) |
| (structure) | Triethylsulfonium iodide |
| (structure) | L-Methionine methylsulfonium iodide |
| (structure) | Dimethyl(phenacyl)sulfonium Bromide |
| (structure) | Dimethyl-(2-methoxy-5-nitro-benzye)-sulfonium Bromide |
| (structure) | DL-Methionine methylsulfonium chloride |
| (structure) | Dimethyl(2-hydroxy-5-nitrobenzue) sulfonium bromide |

-continued

| Compound | Name |
|---|---|
| | Dibenzyl-methyl-sulfonium tetrafluoroborate |
| | Trimethylsulfonium hydroxide solution |
| | Trimethylsulfonium iodide |
| | trimethylsulfonium methylsulfate |
| | (1,1-DImethyl-2-phenyl-ethyl)-dimethyl sulfonium idodie |
| | ((Carboxymethyl-methyl-sulfanylmethyl)-methyl-sulfanyl)-acetic acid |
| | Triethylsulfonium tetrafluoroborate |
| | Trimethylsulfonium tetrafluoroborate |
| | Tris-(2-hydrozyethyl)-sulfonium chloride |
| | S,S,S-Trilaurylthionophosphate |

| Compound | Name |
| --- | --- |
|  | benzyl(diethyl)sulfonium |
|  | Dimethyl-2(2-hydrowy-5-mitrobenzye)-Sulfonium Bromide |
|  | Tri-N-butylsulfonium iodide |
|  | triethylsulfonium |
|  | (2-Carboxyethyl)dimethylsulfonium bromide |
|  | Dimethylsulfoniopropionate |
|  | benzyl(methyl)propylsulfonium |

The above examples are merely illustrative and other like compounds will be so readily apparent to those skilled in the art.

In another embodiment, the sulfonium of the present invention is selected from and not limited to the group of (Ethoxycarbonylmethyl)dimethylsulfonium bromide, (3-Amino-3-carboxypropyl)dimethylsulfonium bromide, Dimethylphenacylsulfonium tetrafluoroborate, Trimethylsulfoxonium chloride, Trimethylsulfoxonium iodide, p-Xylylenebis(tetrahydrothiophenium chloride), Triethylsulfonium iodide, L-Methionine methylsulfonium iodide, Dimethyl(phenacyl)sulfonium Bromide, Dimethyl-(2-methoxy-5-nitro-benzye)-sulfonium Bromide, DL-Methionine methylsulfonium chloride, Dimethy(2-hydroxy-5-nitrobenzue)sulfonium bromide, Dibenzyl-methyl-sulfonium tetrafluoroborate, Trimethylsulfonium hydroxide solution, Trimethylsulfonium iodide, trimethylsulfonium methylsulfate, (1,1-DImethyl-2-phenyl-ethyl)-dimethyl sulfonium idodie, ((Carboxymethyl-methyl-sulfanylmethyl)-methyl-sulfanyl)-acetic acid, Triethylsulfonium tetrafluoroborate, Trimethylsulfonium tetrafluoroborate, Tris-(2-hydroxyethyl)-sulfonium chloride, S,S,S-Trilaurylthionophosphate, benzyl (diethyl)sulfonium, Dimethyl-2(2-hydroxy-5-nitrobenzye)-sulfonium Bromide, Tri-N-butylsulfonium iodide, triethylsulfonium, (2-Carboxyethyl)dimethylsulfonium bromide, Dimethylsulfoniopropionate, benzyl(methyl)propylsulfonium, Nitrobenzyldimethylsulfonium chloride, p-Nitrobenzyldodecylmethylsulfonium chloride, m-Nitrobenzyldodecylmethylsulfonium chloride, o-Nitrobenzyldodecylmethylsulfonium chloride, p-Fluorobenzyldodecylmethylsulfonium chloride, m-Fluorobenzyldodecylmethylsulfonium chloride, o-Fluorobenzyldodecylmethylsulfonium chloride, p-Chlorobenzyldodecylmethylsulfonium chloride, p-Bromobenzyldodecylmethylsulfonium chloride, m-Trifluoromethyldodecylmethylsulfonium chloride, p-Carboxybenzyldodecylmethylsulfonium chloride, p-Cyanobenzyldodecylmethylsulfonium chloride, Benzyldodecylmethylsulfonium chloride.

The concentration of sulfonium salt used in the solutions may vary depending upon the particular salt, the particular metal and the degree of corrosion inhibition desired. Typically, concentrations of from about 0.01 to about 50 mmoles of sulfonium salt per liter of solution are sufficient and concentrations of from about 0.01 to 10 mmoles/liter are generally preferred.

The concentration of sulfonium is expressed in mmoles per liter. Concentration can be converted into parts per million by multiplying the molar concentration to the molecular weight of the said sulfonium compound. For example, 0.1 mmole/liter of Tris-(2-hydroxyethyl) sulfonium Chloride ($C_6H_{15}O_3S^+Cl$), M.W=202.80 will have an equivalent of 20.28 ppm in solution.

Thus, the corrosion problem experienced during the cleaning of semiconductor substrate with metal surfaces can be substantially reduced if not eliminated by incorporating sufficient amount of said sulfonium salts to produce the desired inhibition effect.

Nucleophilic Amines

Compounds suitable for use as the nucleophilic amine compound having oxidation and reduction potentials include certain amines, hydroxylamines, hydrazines and their derivatives as set forth below.

The nucleophilic amine compound used in the present invention does not have to actually take part in oxidation or reduction during a cleaning or stripping process, but must only possess oxidation and reduction qualities in a cleaning or stripping environment. In one embodiment, suitable nucleophilic amine compounds useful in the present invention are compounds having the following formula or salts thereof:

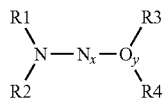

wherein R1, R2, R3 and R4 are either the same or different and selected from the group including hydrogen; a hydroxyl group; a substituted C1-C6 straight-, branched- or cyclo-alkyl, alkenyl or alkynyl group; a substituted acyl group; a straight or branched alkoxy group; an amidyl group; a carboxyl group; an alkoxyalkyl group; an alkylamino group; an alkyl sulfonyl group; or a sulfonic acid group, wherein x=0 when y=1; or x=0 or 1 when y=0; y=0 when x=1; or y=0 or 1 when x=0; provided that R4 is present only when x=1.

In another embodiment, hydroxylamines suitable for use as the nucleophilic amine compound having reduction and oxidation potentials are represented by the following formula or salts thereof:

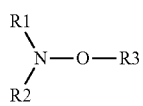

wherein R1, R2 and R3 are independently hydrogen; a hydroxyl group; optionally a substituted $C_1$-$C_6$ straight-, branched- or cyclo-alkyl, alkenyl, or alkynyl group; optionally a substituted acyl group, straight or branched alkoxy group, amidyl group, carboxyl group, alkoxyalkyl group, alkylamino group, alkylsulfonyl group, or sulfonic acid group. Derivatives of these compounds—for example, the amides of the above described—are also suitable for use.

In another embodiment, amines suitable for use as the nucleophilic amine compound of the invention can be represented by the following formula:

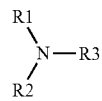

wherein R1, R2 and R3 are independently hydrogen; optionally a substituted $C_1$-$C_6$ straight-, branched- or cyclo-alkyl, alkenyl, or alkynyl group; optionally a substituted acyl group, straight or branched alkoxy group, amidyl group, carboxyl group, alkoxyalkyl group, alkylamino group, or alkylsulfonyl group, sulfonic acid group; or the salt of such compounds.

Hydrazines suitable for use as the nucleophilic amine compound of the present invention can be represented by the following formula or salts thereof:

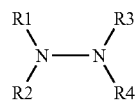

wherein R1, R2, R3 and R4 are independently hydrogen; a hydroxyl group; optionally a substituted $C_1$-$C_6$ straight, branched or cyclo alkyl, alkenyl, or alkynyl group; optionally a substituted acyl group, straight or branched alkoxy group, amidyl group, carboxyl group, alkoxyalkyl group, alkylamino group, alkylsulfonyl group, or sulfonic acid group.

The preferred nucleophilic amine compounds having reduction and oxidation potentials are alkoxy-substituted amines, hydroxylamine, alkyl- or carboxyl-substituted hydroxylamine, and alkyl- or carboxyl-substituted hydrazine. The most preferred compounds are hydroxylamine, N-methylhydroxylamine hydrochloride, N,N-diethylhydroxylamine, and methylhydrazine.

The nucleophic amine may be present in an amount up to 50 percent by weight, more preferably about 5 to about 35 percent by weight, more preferably about 10 to about 25 percent by weight.

Organic Solvents

Organic solvents suitable for use in the present invention are miscible with the nucleophilic amine compound and are preferably water-soluble.

Suitable organic solvents include alkanolamines and their derivatives. Preferably an amine solvent is present alone or in combination with another solvent. While an alkanolamine solvent is still a preferred solvent, it has now been found that other solvents are suitable for use when utilized with at least one nucleophilic amine compound having reduction and oxidation potentials.

Suitable amines are primary, secondary or tertiary amines and are preferably monoamines, diamines or triamines, and, most preferably ethylenediamine, and ethylenetriamine.

The alkanol group of the amines preferably has from 1 to 5 carbon atoms. Preferred alkanolamines suitable for use in the present invention can be represented by the chemical formula $R_1R_2$—N—$CH_2CH_2$—$OR_3$ wherein $R_1$ and $R_2$ can be H, $CH_3$, $CH_3CH_2$ or $CH_2CH_2OH$ and $R_3$ is $CH_2CH_2OH$.

Specific examples of suitable alkanolamines include monoethanol amine, diethanolamine, triethanolamine, tertiarybutyldiethanolamine isopropanolamine, 2-amino-1-propanol, 3-amino-1-propanol, isobutanolamine, 2-amino-2-ethoxy-propanol, and 2-amino-2-ethoxy-ethanol, which is also known as diglycolamine.

Additionally, non-amine solvents, such as dimethyl sulfoxide (DMSO), N-methyl-2-pyrrolidinone, N,N-dimethylpropanamide, N,N-diethylformamide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone.

The solvent may be present in an amount up to about 80 percent by weight, more preferably about 2.5 to about 50 percent by weight, more preferably about 5 to about 35 percent by weight.

Additional polar solvents as known in the art can also be used in the composition of the present invention.

Chelating Agents

Additional chelating agents, such as those known in the art, can also be used in the compositions of the present invention. For example, chelating agents which are metal ion free chelating agents can be utilized, such as nitrilotriacetic acid (NTA), ethylenediaminetetraacetic acid (EDTA), N,N'-bis(2-hydroxyphenyl)ethylenediiminodiacetic acid (HPED), triethylenetetranitrilohexaacetic acid (TTHA), desferriferrioxamin B,N,N',N"-tris[2-(N-hydroxycarbonyl)ethyl]-1,3,5-benzenetricarboxamide (BAMTPH), ethylenediaminediorthohydroxyphenylacetic acid (EDDHA), ethylenediaminetetramethylenephosphonic acid (EDTMP), α-(hydroxyimino) phosphonic acid, propylenediaminetetraacetic acid (PDTA), hydroxypropylenediaminetetraacetic acid (HPDTA), isoserinediacetic acid (ISDA), β-alaninediacetic acid (β-ADA), hydroxyethanediphosphonic acid, diethylenetriaminetetraacetic acid, diethylenetriaminetetramethylenephosphonic acid, hydroxyethyleneaminodiacetic acid, hydroxyethylethylenediaminetriacetic acid, diethylenetriaminepentaacetic acid, diethanolglycine, ethanolglycine, citric acid, glycolic acid, glyoxylic acid, acetic acid, lactic acid, phosphonic acid, glucoheptonic acid or tartaric acid, polyacrylates, carbonates, phosphonates, gluconates, dithiocarbamate, Mannich base, urea, and thiourea or combination thereof.

Chelating agents useful in the composition of the invention are hydroxybenzenes according to the following formula or salts thereof:

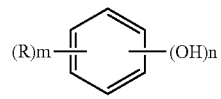

wherein n=1-4, m=2-5 and R is independently hydrogen, optionally a substituted $C_1$-$C_6$ straight-, branched- or cycloalkyl, alkenyl, or alkynyl group; optionally a substituted acyl group, straight or branched alkoxy group, amidyl group, carboxyl group, alkoxyalkyl group, alkylamino group, alkylsulfonyl group, or sulfonic acid group. The preferred compounds are the dihydroxybenzene isomers, and the alkyl substituted dihydroxybenzenes. The most preferred compounds are 1,2-dihydroxybenzene and 1,2-dihydroxy-4-t-butylbenzene.

For example, chelating agents which are metal ion free chelating agents can be utilized, such as thiophenol and its derivative according to the formula:

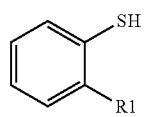

wherein R1=OH or COOH.

For example, chelating agents which are metal ion free chelating agents can be utilized, such as ethylenediaminetetracarboxylic acid or its ammonium salts as shown in the following formula:

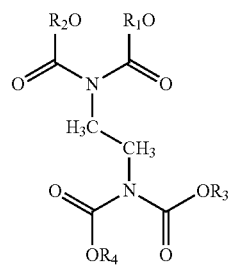

wherein R1, R2, R3 and R4 are independently H or $NH^+$. Sodium, potassium or the like salts are not believed to be suitable for use based upon the understood mechanism of ionic contamination in a microcircuit as caused by cleaning. As evident from the above formula, mono-, di-, tri- and tetra-ammonium carboxylate salts are encompassed.

The chelating agent may be present in an amount of up 25 percent, preferably from about 0.1% to about 20%, for example from about 0.15% to about 6%.

Base

Suitable base include quaternary ammonium salts, which can be represented by the formula:

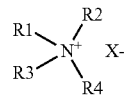

wherein R1, R2, R3, and R4 are short chain alkyl or hydroxy alkyl groups, preferably having from 1 to 5 carbon atoms and wherein R1, R2, R3, and R4 can be the same or different, with the proviso that not all groups are hydroxy alkyl groups, and $X^-$ includes, but is not limited to, halides (such as $Cl^-$ and $Br^-$) and hydroxide anion.

Preferred quaternary ammonium compounds include tetramethylammonium hydroxide (TMAH), choline, bis-choline compounds (e.g., bis-(2-hydroxy-ethyl)-dimethyl-ammonium ion) and the tris-choline compounds (e.g., tris-(2-hydroxy-ethyl)-methyl-ammonium ion), or a combination thereof.

In the compositions and processes of this invention, the choline compound includes, but is not limited to, tris-choline hydroxide, bis-choline hydroxide, tris-choline bicarbonate, bis-choline bicarbonate, tris-choline chloride, or bis-choline chloride. Preferably, the choline compound is bis-choline hydroxide and/or tris-choline hydroxide.

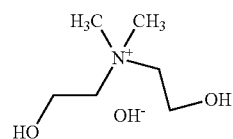

Bis Choline

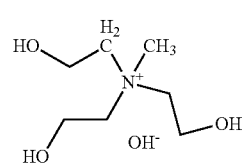

Tris Choline

The quaternary ammonium compound may be present in an amount from about 0.1 to about 60 percent, more preferably from about 1 to about 20 percent by weight.

Acid

In one embodiment, the compositions of the present invention comprise of organic acids, mineral acids or mixtures thereof.

Mineral acids may be non-oxidizing or oxidizing acid, such HF, $HBF_4$, HCl, $H_2SO_4$, $H_3PO_4$, $HNO_3$, $HClO_4$, $CrO_3$, periodic acid, phosphorous acid.

Organic acids are carboxylic acids, e.g., mono-, di- and/or tri-carboxylic acids optionally substituted in a beta position with a hydroxy, carbonyl or amino group. Organic acid species useful in the composition include, but are not limited to, formic acid, acetic acid, propanoic acid, butyric acid and the like; hydroxyl-substituted carboxylic acids including, but not limited to, glycolic acid, lactic acid, tartaric acid and the like; oxalic acid; glycolic acid; amino substituted carboxylic acids including but not limited to glycine, hydroxyethylglycine, cysteine, alanine and the like; cyclic carboxylic acids including but not limited to ascorbic acid and the like; oxalic acid, citric acid, or mixtures thereof.

More preferred are organic acids with a carbonyl group substituted on the carbon adjacent to the carboxyl group carbon. Exemplary preferred organic acids are oxalic acid, glycolic acid or mixtures thereof.

The acid is advantageously present at up to about 10%, preferably from about 0.1% to about 8%, for example from about 0.15% to about 6%.

Compositions and Methods

One of embodiment is a method of cleaning metal containing substrates where the sulfonium compound is admixed with a semiconductor processing composition prior to the use of such composition wherein said composition subsequently contacts a metal surface used in semiconductor processing applications, having a passivating effect on, said metal surface.

Another embodiment is a composition which is useful in methods for passivating metal as described in a number of applications involved in the electronic fabrication process, including removing one or more of resist, etching residue, polymer, and planarization residue.

said composition comprising: a) one or more sulfonium compounds, b) one or more nucleophilic amines; b) one or more chelating agents; and d) water.

Another embodiment is a composition comprising; a) sufficient amount of one or more sulfonium compound, for example compound listed in Table IV or mixtures thereof, present in the solution in an amount from about 2 mmoles/liter, b) a chelating agent, for example EDTA, DTPA, or mixtures thereof, present in the solution in an amount from about 0.1% to about 8%, for example from about 0.5% to about 2% by weight, b) an nucleophilic amine, for example N,N diethylhydroxylamine, hydroxylamine or mixtures thereof, present in the solution in an amount from about 0.1% to about 20%, for example from about 0.5% to about 4% by weight; and, cyan acid compound, for example citric acid, glycolic acid, present in the solution in an amount from about 0.1% to about 20%, for example from about 0.5% to about 4% by weight, and optionally containing a polar organic solvent, or an alkanolamine and a surfactant.

The compositions according to, a preferred embodiment of this invention contain hydroxylamine, sulfonium compound, and ethylenediaminetetracarboxylic acid or its ammonium salt.

In some embodiments, the composition further consists of a second corrosion inhibitor or chelating agent, such as a dithiocarbamate, Mannich base, urea, thiourea, or the likes for synergistic effect.

In some embodiments the composition further comprise of organic solvents.

In other embodiments, the composition further comprise of a non-oxidizing acid.

Another embodiment is a composition which is useful in methods for passivating metal as described in a number of applications involved in the electronic fabrication process, including removing one or more of resist, etching residue, polymer, and planarization residue, said composition comprising: a) one or more sulfonium compounds, b) one or more non oxidizing acids; b) one or more chelating agents; and d) water.

The acid solutions suitable for use herein are aqueous solutions of non-oxidizing inorganic acids, such as HF, HCl, $H_2SO_4$, $H_3PO_4$, $HBF_4$ etc., and mixtures thereof; or aqueous solutions of organic acids, such as formic acid acetic acid, sulfamic acid, hydroxy acetic, citric acid, etc., and mixtures thereof.

In one embodiment of the present invention, the remover composition further comprises a) one or more sulfonium compound, b) one or more chelating agents and c) water.

The preferred chelating agent is ethylenediaminetetraacetic acid, hereafter EDTA and its ammonium, amine, or ammonium salts, polyaminepolycarboxylic acids or the likes in combination mixtures thereof.

The preferred cleaning solutions are aqueous solutions of HCl or HF and aqueous solutions of EDTA and amine or alkali metal salts of EDTA.

The solutions may be buffered to maintain a desired pH level with conventional buffering agents, such as citric acid, acetic acid, amines including primary, secondary and tertiary amine, trishydroxylethyl ammonium hydroxide, tetramethylammonium hydroxide choline, trischoline, and their salts thereof.

The pH values of cleaning solutions typically range from 1 to 12.

EXAMPLES

The following examples further illustrate the invention.

Exemplary embodiments of the present invention will be illustrated by reference to the following examples, which are included to exemplify, but not limit the scope of the present invention. In particular, although the examples are related to use of the compositions to remove residues, one of skill in the art would easily understand that such compositions can be used in many applications and the benefits relating to copper passivation are realized wherever copper compounds are contacted with such compositions.

Sulfonium is added to the solutions after they have been mixed according to the concentration in Table IV.

Corresponding formulations were prepared with and without the sulfonium compound as corrosion inhibitor. The substrates containing copper metal were immersed in the solution at 25° C. or 50° C. for 60 seconds; the substrates were then removed from the solutions, rinse with D.I water and dried. The copper corrosion is determined by sheet resistance measurement by means of a point probe instrument. Less or no sheet resistance change on the sample before and after treating with the present invention. The sample with sulfonium compound drastically resulted in reduction of the copper etch rate.

ABBREVIATIONS

EDTA=ethylene diaminetetraacetic acid
DAE=diammonium EDTA
TAE=tetraammonium EDTA
DGA=diglycolamine
HAFB=hydroxylamine freebase 50% in water
MEA=monoethanolamine
DMSO=dimethylsulfoxide
DMAC=dimethylacetamide
DEHA=N,N-diethyl hydroxylamine
DMHA=N,N-dimethyhydroxylamine
PMHA=N Phenyl, N methylhydroxylamine
THEMAH=Tris(hydroxyethyl) ammonium hydroxide 60% solution
ABF=ammonium bifluoride
TFBA=tetrafluoroboric acid
TMAH=tetramethylammonium hydroxide 25% solution
Glycolic=Glycolic acid or hydroxyacetic acid 70% solution
Citric Acid=Citric
Choline=choline hydroxide 45% solution
$NH_4OH$=ammonium hydroxide 28% solution
DEAE=Diethylamino ethanol
HEDP=1-hydroxyethane, 1,1 diphosphonic acid

TABLE III

Compound designation for example references

| Number | Name |
|---|---|
| 1 | methylbenzyldodecylmethylsulfonium chloride |
| 2 | isopropylbenzyldodecylmethylsulfonium chloride |
| 3 | 4-Octylbenzyldimethylsulfonium chloride |
| 4 | p-n-dodecylbenzyldimethylsulfonium chloride |
| 5 | p-n-dodecylbenzyl(butyl)methylsulfonium chloride |
| 6 | p-n-dodecylbenzyldihydroxyethylsulfonium chloride |
| 7 | p-n-dodecylbenzyldibutylsulfonium chloride |
| 8 | p-n-dodecylbenzyldodecylmethylsulfonium chloride |
| 9 | p-n-heptadecylbenzyldimethylsulfonium chloride |
| 10 | benzyldodecylmethylsulfonium bromide |
| 11 | dodecylphenoxybenzyldimethylsulfonium chloride |
| 12 | p-Nitrobenzyldimethylsulfonium chloride |
| 13 | p-Nitrobenzyldodecylmethylsulfonium chloride |
| 14 | m-Nitrobenzyldodecylmethylsulfonium chloride |
| 15 | o-Nitrobenzyldodecylmethylsulfonium chloride |
| 16 | p-Fluorobenzyldodecylmethylsulfonium chloride |
| 17 | o-Fluorobenzyldodecylmethylsulfonium chloride |
| 18 | m-Fluorobenzyldodecylmethylsulfonium chloride |
| 19 | p-Chlorobenzyldodecylmethylsulfonium chloride |
| 20 | p-Bromobenzyldodecylmethylsulfonium chloride |
| 21 | m-Trifluoromethyldodecylmethylsulfonium chloride |
| 22 | p-Carboxybenzyldodecylmethylsulfonium chloride |
| 23 | p•Cyanobenzyldodecylmethylsulfonium chloride |
| 24 | Benzyldodecylmethylsulfonium chloride |
| 25 | (Ethoxycarbonylmethyl)dimethylsulfonium bromide |
| 26 | (3-Amino-3-carboxypropyl)dimethylsulfonium bromide |
| 27 | Dimethylphenacylsulfonium tetrafluoroborate |
| 28 | Trimethylsulfoxonium chloride |
| 29 | Trimethylsulfoxonium iodide |
| 30 | p-Xylylenebis(tetrahydrothiophenium chloride) |
| 31 | Triethylsulfonium iodide |
| 32 | L-Methionine methylsulfonium iodide |
| 33 | Dimethyl(phenacyl)sulfonium Bromide |
| 34 | Dimethyl-(2-methoxy-5-nitro-benzye)-sulfonium Bromide |
| 35 | DL-Methionine methylsulfonium chloride |
| 36 | Dimethy(2-hydroxy-5-nitrobenzue)sulfonium bromide |
| 37 | Dibenzyl-methyl-sulfonium tetrafluoroborate |
| 38 | Trimethylsulfonium hydroxide solution |
| 39 | Trimethylsulfonium iodide |
| 40 | trimethylsulfonium methylsulfate |
| 41 | (1,1-Dimethyl-2-phenyl-ethyl)-dimethyl sulfonium idodie |
| 42 | ((Carboxymethyl-methyl-sulfanylmethyl)-methyl-sulfanyl)-acetic acid |
| 43 | Triethylsulfonium tetrafluoroborate |
| 44 | Trimethylsulfonium tetrafluoroborate |
| 45 | Tris-(2-hydroxyethyl)-sulfonium chloride |
| 46 | S,S,S-Trilaurylthionophosphate |
| 47 | benzyl(diethyl)sulfonium |
| 48 | Dimethyl-2(2-hydroxy-5-nitrobenzye)-sulfonium Bromide |
| 49 | Tri-N-butylsulfonium iodide |
| 50 | triethylsulfonium |
| 51 | (2-Carboxyethyl)dimethylsulfonium bromide |
| 52 | Dimethylsulfoniopropionate |
| 53 | benzyl(methyl)propylsulfonium |
| 54 | p-n-dodecylbenzylthiophenium chloride |

TABLE IV

EXAMPLES

| Ex | Cpd # | Sulfonium (mmoles/Liter) conc. | Chelating agent Namce | Wt % | Namce | Wt % | Nucleophilic Amine Namce | Wt % | | |
|---|---|---|---|---|---|---|---|---|---|---|
| 1 | 6 | 1.0 | TAE | 17.50 | Catechol | 5.00 | DEHA | 5.00 | | |
| 2 | 6 | 0.5 | DAE | 5.00 | | | HAFB | 25.00 | | |
| 3 | 45 | 3.0 | DAE | 5.00 | | | HAFB | 35.00 | | |
| 4 | 45 | 3.0 | EDTA | 5.00 | | | HAFB | 30.00 | DEHA | 10.00 |
| 5 | 45 | 3.0 | DAE | 5.00 | | | HAFB | 30.00 | DEHA | 10.00 |
| 6 | 37 | 2.0 | DAE | 5.00 | | | HAFB | 40.00 | | |
| 7 | 45 | 3.0 | TAE | 5.00 | | | HAFB | 40.00 | | |
| 8 | 45 | 1.0 | EDTA | 13.00 | Catechol | 5.00 | DEHA | 5.00 | | |
| 9 | 53 | 2.0 | | | | | HAFB | 5.00 | | |
| 10 | 6 | 1.0 | | | | | HAFB | 12.50 | | |
| 11 | 6 | 1.0 | | | | | HAFB | 12.50 | | |
| 12 | 24 | 0.2 | | | | | HAFB | 16.00 | | |
| 13 | 24 | 2.0 | | | Catechol | 5.00 | HAFB | 35.00 | | |
| 14 | 45 | 5.0 | | | | | HAFB | 35.00 | | |
| 15 | 37 | 4.0 | TAE | 5.00 | | | DEHA | 10.00 | | |
| 16 | 45 | 4.0 | TAE | 5.00 | | | DEHA | 10.00 | | |
| 17 | 24 | 4.0 | TAE | 5.00 | | | DEHA | 10.00 | | |
| 18 | 25 | 2.0 | TAE | 5.00 | | | DEHA | 10.00 | | |
| 19 | 15 | 0.2 | TAE | 10.00 | | | DEHA | 25.00 | | |
| 20 | 32 | 1.0 | | | | | HAFB | 5.00 | | |

TABLE IV-continued

EXAMPLES

| | | | | | | | | |
|---|---|---|---|---|---|---|---|---|
| 21 | 45 | 5.0 | EDTA | 13.00 | | HAFB | 0.10 | |
| 22 | 53 | 0.1 | EDTA | 4.00 | | HAFB | 0.50 | |
| 23 | 24 | 0.2 | HEDP | 5.00 | | DEHA | 0.05 | |
| 24 | 35 | 0.5 | DAE | 13.00 | | HAFB | 0.99 | |
| 25 | 24 | 2.5 | HEDP | 5.00 | | DEHA | 10.00 | |
| 26 | 25 | 8.0 | HEDP | 5.00 | | DEHA | 0.99 | |

| | Acid | | Base | | Solvent | | | | | |
|---|---|---|---|---|---|---|---|---|---|---|
| Ex | Namce | Wt % | Namce | Wt % | Namce | Wt % | Water | Other | | Total |
| 1 | | | | | DGA | 60.00 | 12.50 | | | 100.00 |
| 2 | Citric | 5.00 | | | MEA | 5.00 | 60.00 | | | 100.00 |
| 3 | | | | | DGA | 60.00 | 0.00 | | | 100.00 |
| 4 | | | | | DMSO | 55.00 | 0.00 | | | 100.00 |
| 5 | | | | | DMSO | 55.00 | 0.00 | | | 100.00 |
| 6 | | | | | DMSO | 55.00 | 0.00 | | | 100.00 |
| 7 | | | | | DMSO | 55.00 | 0.00 | | | 100.00 |
| 8 | | | NH4OH | 3.00 | DGA | 55.00 | 19.00 | | | 100.00 |
| 9 | | | Choline | 25.00 | | | 70.00 | | | 100.00 |
| 10 | | | Choline | 1.00 | | 0.00 | 86.50 | | | 100.00 |
| 11 | | | Choline | 1.00 | | | 86.50 | ABF | 0.001 | 100.00 |
| 12 | | | Choline | 4.50 | | | 79.50 | | | 100.00 |
| 13 | | | | | DGA | 60.00 | | | | 100.00 |
| 14 | | | | | | 60.00 | 5.00 | | | 100.00 |
| 15 | glycolic | 5.00 | Choline | 3.00 | | | 77.00 | | | 100.00 |
| 16 | glycolic | 5.00 | THEMAH | 5.00 | | | 75.00 | | | 100.00 |
| 17 | glycolic | 5.00 | TMAH | 3.00 | | | 77.00 | | | 100.00 |
| 18 | | | TMAH | 5.00 | DEAE | 5.00 | 75.00 | | | 100.00 |
| 19 | | | | | | | 85.00 | | | 100.00 |
| 20 | glycolic | 10.00 | | | | | 85.00 | | | 100.00 |
| 21 | glycolic | 10.00 | | | | | 76.90 | | | 100.00 |
| 22 | citric | 9.50 | | | | | 86.00 | | | 100.00 |
| 23 | citric | 5.00 | | | | | 89.95 | | | 100.00 |
| 24 | glycolic | 10.00 | | | | | 76.00 | TFBA | 0.01 | 100.00 |
| 25 | | | | | DEAE | 5 | 79.995 | AF | 0.005 | 100.00 |
| 26 | | | | | | | 94.0 | ABF | 0.01 | 100.00 |

As such, the cleaning composition for removing resists according to the present invention exhibits excellent removing efficiency of the resist residue and excellent corrosion-proof effects on the copper interconnection film and the insulating film. Accordingly, it is possible, during the manufacture of the semiconductor device, to prevent narrowing of an interval between the copper interconnections, degradation in characteristics such a decrease of driving speed of semiconductor elements, and a defect such as short-circuit between the interconnections As emphasized above, the applications described herein are not intended to be limiting and could include other applications, such as wafer level packaging rework, the removal of solder bumps, photoresist removal or other electronic fabrication processes where Cu or other metals are exposed during the processing.

The wafer surface after being treated with the sulfonium compound 53 in Table IV (i.e. benzyl(methyl)propylsulfonium chloride), nucleophilic amine (hydroxylamine) and a chelating agent (ethylenediaminetetracarboxylic acid) as described above Ex 22 will prevent metal corrosion. Those skilled in the art will recognize other copper related surfaces that come in contact, or could be made to come in contact, with the cleaning solution of the present invention that are also effectively with other sulfonium compound and other chelator compounds. For example, the corrosion inhibiting compounds of the present invention could also be used to not only inhibit substrate corrosion, but also inhibit the corrosion of copper containing machinery employed during cleaning processes and thereby prolong the life of such machinery.

The above list of components should not be construed as an exhaustive list and those skilled in the art will recognize that other compounds may be for the present invention.

Although the foregoing invention has been described in some detail for purposes of clarity of understanding, it will be apparent that certain changes and modifications may be practiced within the scope of the appended claims. For example, while the specification describes introducing the corrosion inhibiting compound for semiconductor cleaning and stripping, there is no reason why in principle the corrosion inhibiting compound of the present invention cannot be introduced in other application involving copper and hydroxylamine, such as a post-CMP application. Therefore, the present embodiments are to be considered as illustrative and not restrictive, and the invention is not to be limited to the details given herein, but may be modified within the scope of the appended claims.

Having described the invention in detail, those skilled in the art will appreciate that, given the present disclosure; modifications may be made to the invention without departing from the spirit of the inventive concept described herein. Therefore, it is not intended that the scope of the invention be limited to the specific embodiments illustrated and described.

What is claimed is:

1. A aqueous or semi aqueous cleaning composition comprising:
   i. one or more sulfonium compound or salts thereof wherein the sulfonium compound is selected from the group consisting of methylbenzyldodecylmethylsulfonium chloride, isopropylbenzyldodecylmethylsulfonium chloride, 4-Octylbenzyldimethylsulfonium chloride, p-n-dodecvlbenzyldimethylsulfonium chloride, p-n-dodecylbenzyl(butyl)methylsulfonium chloride, p-n-dodecylbenzyldihydroxyethylsulfonium chloride, p-n-dodecylbenzyldibutylsulfonium chloride, p-n-dodecylbenzyldodecylmethylsulfonium chloride, p-n-heptadecylbenzldimethylsulfonium chloride, benzyldodecylmethylsulfonium bromide, dodecylphenoxybenzyldimethylsulfonium chloride, p-Nitrobenzyldimethylsulfonium chloride, p-Nitrobenzyldodecylmethylsulfonium chloride, m-Nitrobenzyldodecylmethylsulfonium chloride, o-Nitrobenzyldodecylmethylsulfonium chloride, p-Fluorobenzyldodecylmethylsulfonium chloride, o-Fluorobenzldodecylmethylsulfonium chloride, m-Fluorobenzyldodecylmethylsulfonium chloride, p-Chlorobenzyldodecylmethylsulfonium chloride, p-Bromobenzyldodecylmethylsulfonium chloride, m-Trifluoromethyldodecylmethylsulfonium chloride, p-Carboxybenzyldodecylmethylsulfonium chloride, p-Cyanobenzyldodecylmethylsulfonium chloride, Benzyldodecylmethylsulfonium chloride, (Ethoxycarbonylmethyl)dimethylsulfonium bromide, (3-Amino-3-carboxypropyl)dimethylsulfonium bromide, Dimethylphenacylsulfonium tetrafluoroborate, Trimethylsulfonium chloride, Trimethylsulfonium iodide, p-Xylylenebis(tetrahydrothiophenium chloride), Triethylsulfonium iodide, L-Methionine methylsulfonium iodide, Dimethyl(phenacyl)sulfonium Bromide, Dimethyl-(2-methoxy-5-nitro-benzye)-sulfonium Bromide, DL-Methionine methylsulfonium chloride, Dimethy(2-hydroxy-5-nitrobenzue)sulfonium bromide, Dibenzylmethyl-sulfonium tetrafluoroborate, Trimethylsulfonium hydroxide solution, trimethylsulfonium methylsulfate, (1,1-Dimethyl-2-phenyl-ethyl)-dimethyl sulfonium iodide, (((Carboxymethyl-methyl-sulfanylmethyl)-methyl-sulfanyl)-acetic acid, Triethylsulfonium tetrafluoroborate, Trimethylsulfonium tetrafluoroborate, Tris-(2-hydroxyethyl)-sulfonium chloride, S,S,S-Trilaurylthionophosphate, benzyl(diethyl)sulfonium, Dimethyl-2(2-hydroxy-5-nitrobenzye)-sulfonium Bromide, Tri-N-butylsulfonium iodide, (2-Carboxyethyl) dimethylsulfonium bromide, Dimethylsulfoniopropionate, benzyl(methyl)propylsulfonium, p-n-dodecylbenzylthiophenium chloride and the like;

ii. one or more nucleophilic amines or salts thereof;

iii. water.

2. The composition of claim 1, wherein the sulfonium compound is present in an amount at least sufficient to inhibit the corrosion of metal.

3. The composition of claim 1, wherein the sulfonium compound is present from about 0.01 mmoles per liter to about 100 mmoles per liter.

4. The composition of claim 1, wherein the nucleophilic amine is presented in an amount from about 0.01 weight percent to about 50 weight percent and is selected from a group consisting of hydroxylamine, N,N dimethylhydroxylamine, N,N diethylhdroxylamine, N phenylhydroxylamine, hydrazine, tetramethylhydrazine and their salts or thereof.

5. The composition of claim 1 is further comprising a chelating agent, wherein is selected from the group consisting of hydroxybenzenes, carboxylic acid, phosphonic acid, thiocarbamate, ethylenediaminetetraacetic acid (EDTA), N,N'-bis(2-hydroxyphenyl)ethylenediiminodiacetic acid (HPED), 1-hydroxyethane, 1,1 diphosphonic acid, triethylenetetranitrilohexaacetic acid (TTHA), Mannich base, iminodiacetic acid and their derivatives or salts or combination thereof.

6. The composition of claim 1 further comprising a non-oxidizing acid, wherein is selected from the group consisting of HF, HCl, $H_2SO_4$, $HBF_4$, $H_3PO_4$, acetic acid, hydroxyacetic acid, citric acid or combination thereof.

7. The composition of claim 5 further comprising a non-oxidizing acid, wherein is selected from the group consisting of HF, HCl, $H_2SO_4$, $HBF_4$, $H_3PO_4$, acetic acid, hydroxyacetic acid, citric acid or combination thereof.

8. The composition of claim 1 further comprising at least one solvent which is miscible with the nucleophilic amine.

9. The composition of claim 1, wherein the pH is further adjusted by the addition of acid or base.

* * * * *